(12) United States Patent
Kim et al.

(10) Patent No.: US 11,744,136 B2
(45) Date of Patent: Aug. 29, 2023

(54) MASK ASSEMBLY, APPARATUS FOR MANUFACTURING DISPLAY APPARATUS, AND METHOD OF MANUFACTURING DISPLAY APPARATUS

(71) Applicant: Samsung Display Co., Ltd., Yongin-si (KR)

(72) Inventors: Sanghoon Kim, Yongin-si (KR); Jongsung Park, Yongin-si (KR); Wonyoung Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 119 days.

(21) Appl. No.: 16/953,263

(22) Filed: Nov. 19, 2020

(65) Prior Publication Data

US 2021/0305542 A1   Sep. 30, 2021

(30) Foreign Application Priority Data

Mar. 25, 2020 (KR) .................. 10-2020-0036430

(51) Int. Cl.
| | |
|---|---|
| *H01L 51/56* | (2006.01) |
| *H01L 51/00* | (2006.01) |
| *H10K 71/00* | (2023.01) |
| *C23C 14/04* | (2006.01) |
| *H10K 71/16* | (2023.01) |
| *H10K 59/12* | (2023.01) |

(52) U.S. Cl.
CPC ........... *H10K 71/00* (2023.02); *C23C 14/042* (2013.01); *H10K 59/1201* (2023.02); *H10K 71/166* (2023.02); *H10K 59/12* (2023.02)

(58) Field of Classification Search
CPC .................................................... C23C 14/042
See application file for complete search history.

(56) References Cited

U.S. PATENT DOCUMENTS

| | | | |
|---|---|---|---|
| 8,729,570 B2 * | 5/2014 | Lee | ............. H01L 27/3211 |
| | | | 438/34 |
| 9,346,078 B2 | 5/2016 | Oh et al. | |
| 10,014,471 B2 | 7/2018 | Baek | |

(Continued)

FOREIGN PATENT DOCUMENTS

| | | | | | |
|---|---|---|---|---|---|
| CN | 106552993 A | * | 4/2017 | ............. | B23K 26/21 |
| KR | 10-2015-0096590 | * | 8/2015 | ........... | C23C 14/042 |

(Continued)

OTHER PUBLICATIONS

Machine translation, Kawano, Chinese Pat. Pub. No. CN106552993A, translation date: Aug. 6, 2022, Espacenet, all pages. (Year: 2022).*

(Continued)

*Primary Examiner* — Victoria K. Hall
(74) *Attorney, Agent, or Firm* — H.C. Park & Associates, PLC

(57) ABSTRACT

Provided is a mask assembly including a mask frame including an opening; and a mask arranged on the mask frame and including a deposition region and a non-opening region arranged around the deposition region, the deposition region facing the opening to transmit a deposition material. A width of the non-opening region in a lengthwise direction of the mask is about 200 μm to about 500 μm.

11 Claims, 9 Drawing Sheets

(56) References Cited

U.S. PATENT DOCUMENTS

| | | | |
|---|---|---|---|
| 10,141,511 B2 | 11/2018 | Kim | |
| 10,344,376 B2 | 7/2019 | Hong | |
| 2011/0193476 A1* | 8/2011 | Higo | H01L 51/0059 |
| | | | 445/24 |
| 2012/0237679 A1* | 9/2012 | Madigan | C23C 14/243 |
| | | | 219/428 |
| 2018/0355468 A1* | 12/2018 | Wang | H10K 71/00 |

FOREIGN PATENT DOCUMENTS

| | | | | |
|---|---|---|---|---|
| KR | 10-2017-0075113 | | 7/2017 | |
| KR | 10-2017-0105684 | | 9/2017 | |
| KR | 10-1837624 | | 3/2018 | |
| KR | 10-2019-0071476 | * | 6/2019 | B21D 31/04 |
| KR | 10-2002494 | | 7/2019 | |
| WO | WO2017/006821 A1 | * | 1/2017 | C23C 14/04 |

OTHER PUBLICATIONS

Machine translation, Jung, Korean Pat. Pub. No. KR20150096590A, translation date: Aug. 4, 2022, Espacenet, all pages. (Year: 2022).*
Machine translation, Sung, Korean Pat. Pub. No. KR20190071476A, translation date: Aug. 4, 2022, Espacenet, all pages. (Year: 2022).*
Machine translation, Takeda, WIPO Pat. Pub. No. WO2017/006821A1, translation date: Apr. 12, 2023, Clarivate Analytics, all pages. (Year: 2023).*

* cited by examiner

MASK ASSEMBLY, APPARATUS FOR MANUFACTURING DISPLAY APPARATUS, AND METHOD OF MANUFACTURING DISPLAY APPARATUS

CROSS-REFERENCE TO RELATED APPLICATION

This application claims priority from and the benefit of Korean Patent Application No. 10-2020-0036430, filed on Mar. 25, 2020, which is hereby incorporated by reference for all purposes as if fully set forth herein.

BACKGROUND

Field

Exemplary embodiments of the invention relate generally to mask assemblies and apparatuses for manufacturing a display apparatus and, more particularly, to a mask assembly having an improved deposition yield and a method of manufacturing a display apparatus.

Discussion of the Background

With the developments in the information society, the demand for a display apparatus for displaying an image of various type is increasing. In the display apparatus field, large-sized cathode ray tubes (CRT) have rapidly evolved into thin, light, and large-area flat panel displays (FPD). Examples of the FPDs include a liquid crystal display (LCD), a plasma display panel (PDP), an organic light-emitting display (OLED), and an electrophoretic display (ED).

OLEDs from among display apparatuses include an organic light-emitting diode including an opposite electrode, a pixel electrode, and an emission layer. The opposite and pixel electrodes and the emission layer may be formed via various methods, one of which is an independent deposition method. In the independent deposition method, a fine metal mask (FMM) is extended and adhered to a mask frame, and a deposition material is deposited on a surface on which deposition is to be performed.

The above information disclosed in this Background section is only for understanding of the background of the inventive concepts, and, therefore, it may contain information that does not constitute prior art.

SUMMARY

Devices constructed according to exemplary embodiments of the invention are capable of having improved pixel position accuracy (PPA), and an apparatus for manufacturing a display apparatus.

Additional aspects will be set forth in part in the description which follows and, in part, will be apparent from the description, or may be learned by practice of the presented embodiments of the disclosure According to one or more implementations of the invention, a display device includes a mask frame including an opening and surrounding the opening; and a mask arranged on the mask frame and including a deposition region and a non-opening region around the deposition region, the deposition region facing the opening to transmit a deposition material, wherein a width of the non-opening region in a lengthwise direction of the mask is about 200 μm to about 500 μm.

According to the present embodiment, the non-opening region of the mask may include a first portion and a second portion having a less thickness than the first portion.

According to the present embodiment, the second portion may be obtained via half etching in a thickness direction of the mask.

According to the present embodiment, the non-opening region may surround at least a portion of the deposition region.

According to the present embodiment, the mask frame may further include a support stick extending in a direction that intersects the lengthwise direction of the mask.

According to the present embodiment, the non-opening region of the mask may overlap the support stick.

According to the present embodiment, the mask may further include a welding region that is welded and fixed to the mask frame.

According to the present embodiment, the welding region may be provided at both ends of the mask.

According to the present embodiment, the welding region of the mask may include a first nugget.

According to the present embodiment, the non-opening region of the mask may include a second nugget.

According to the present embodiment, a width of the mask may be less than a width of the opening, and a plurality of masks may be mounted on the mask frame.

According to one or more embodiments, an apparatus for manufacturing a display apparatus includes a chamber in which a substrate is arranged; a deposition source arranged in the chamber and configured to supply a deposition material into the chamber; and a mask assembly arranged to face the deposition source and configured to transmit the deposition material and deposit the deposition material on the substrate. The mask assembly may include a mask frame including an opening; and a mask arranged on the mask frame and including a deposition region and a non-opening region around the deposition region, the deposition region facing the opening to transmit the deposition material. A width of the non-opening region in a lengthwise direction of the mask is about 200 μm to about 500 μm.

According to the present embodiment, the non-opening region of the mask may include a first portion and a second portion having a less thickness than the first portion.

According to the present embodiment, the second portion may be obtained via half etching in a thickness direction of the mask.

According to the present embodiment, the non-opening region may surround at least a portion of the deposition region.

According to the present embodiment, the mask frame may further include a support stick extending in a direction that intersects the lengthwise direction of the mask.

According to the present embodiment, the non-opening region of the mask may overlap the support stick.

According to the present embodiment, the mask may further include a welding region that is welded and fixed to the mask frame, and the welding region may be provided at both ends of the mask.

According to the present embodiment, the welding region of the mask may include a first nugget, and the non-opening region of the mask may include a second nugget.

According to one or more embodiments, a method of manufacturing a display apparatus includes forming a pixel electrode; forming an emission layer on the pixel electrode by using the above-described apparatus for manufacturing a display apparatus; and forming an opposite electrode on the emission layer.

These and/or other aspects will become apparent and more readily appreciated from the following description of the embodiments, the claims, and the accompanying drawings.

It is to be understood that both the foregoing general description and the following detailed description are exemplary and explanatory and are intended to provide further explanation of the invention as claimed.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
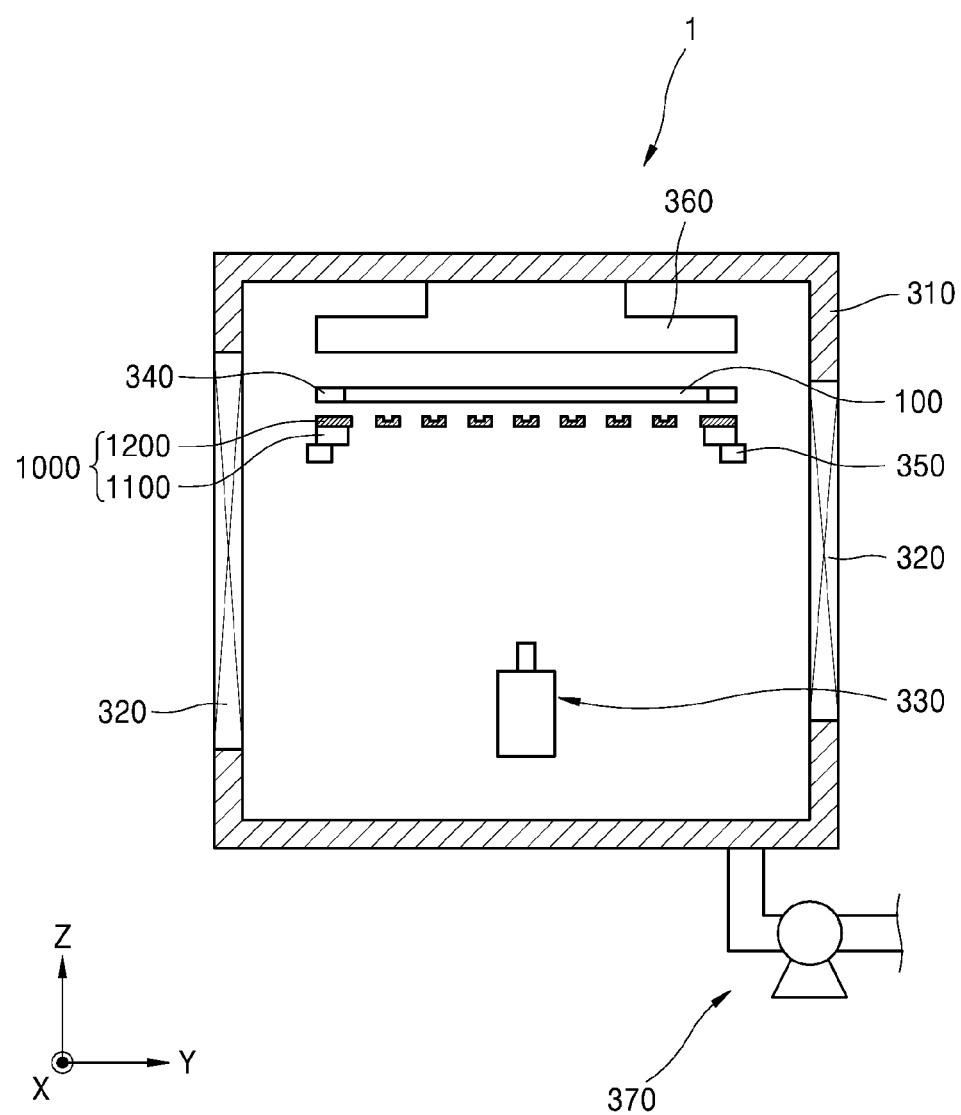
FIG. 1 is a schematic cross-sectional view illustrating an apparatus for manufacturing a display apparatus, according to exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Hereinafter, effects and features of the inventive concepts and a method to accomplish them will be described more fully with reference to the accompanying drawings, in which embodiments of the disclosure are illustrated. This disclosure may, however, be embodied in many different forms and should not be construed as limited to the embodiments set forth herein.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. For example, because sizes and thicknesses of components in the drawings are arbitrarily illustrated for convenience of explanation, the following embodiments are not limited thereto.

In the present specification, "A and/or B" represents A or B, or A and B. The expression "at least one of A and B" indicates only A, only B, both A and B, or variations thereof.

In the following embodiments, the meaning that a wire extends in a first direction or a second direction encompasses not only extending in a straight line but also extending in zigzags or in a curve in the first direction or the second direction.

In the following embodiments, when referred to "planar", it means when an object is viewed from above, and when referred to "sectional", it means when a cross section formed by vertically cutting an object is viewed from the side. In the following embodiments, when referred to "overlapping", it encompasses "planar" overlapping and "cross-sectional" overlapping.

One or more embodiments of the disclosure will be described below in more detail with reference to the accompanying drawings. Those components that are the same or are in correspondence are rendered the same reference numeral regardless of the figure number.

Figure 2:
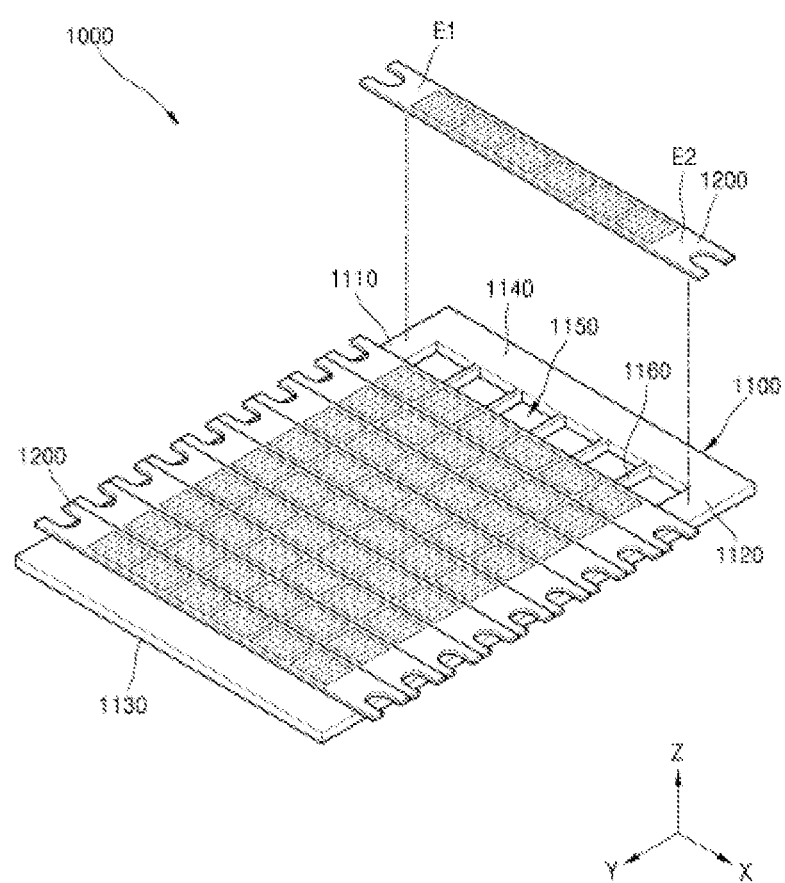
FIG. 2 is a perspective view illustrating a mask assembly according to an exemplary embodiment of the invention.
Figure 3:
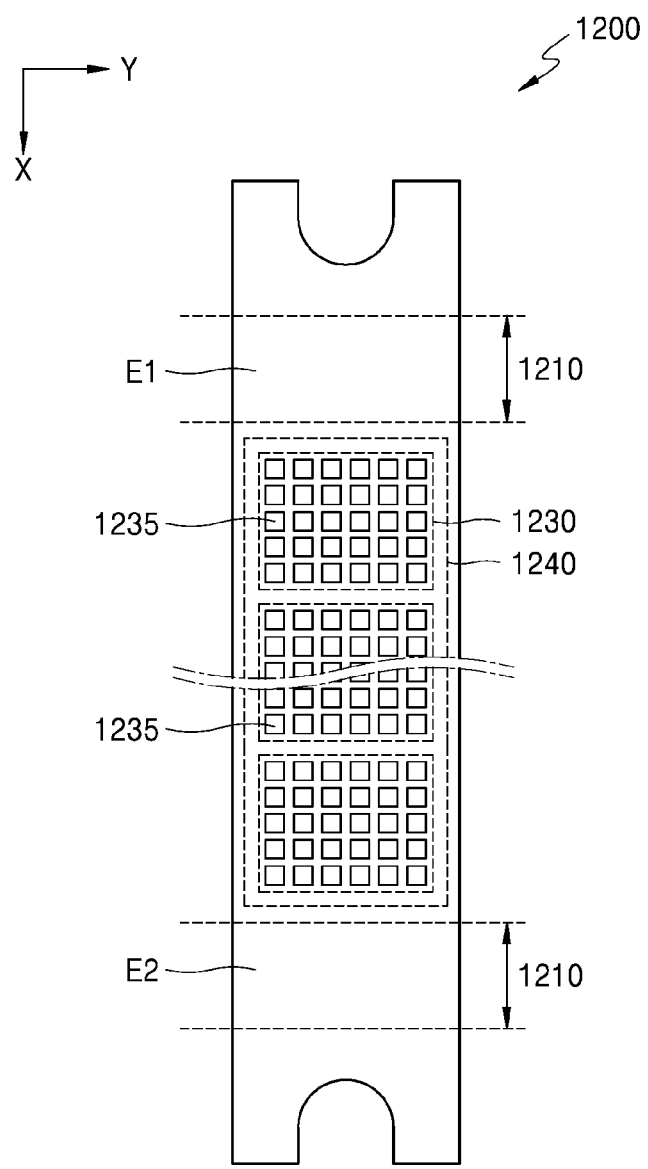
FIG. 3 is a schematic plan view illustrating a mask according to an exemplary embodiment of the invention.

FIG. 1 is a schematic cross-sectional view illustrating an apparatus configured to manufacture a display apparatus, according to an embodiment, FIG. 2 is a perspective view illustrating a mask assembly according to an embodiment, and FIG. 3 is a schematic plan view illustrating a mask according to an embodiment.

Referring to FIG. 1, an apparatus 1 configured to manufacture a display apparatus may include a chamber 310, a shield unit 320, a deposition source 330, a substrate support 340, a mask support 350, a magnetic force generator 360, a pressure adjuster 370, and a mask assembly 1000.

The chamber 310 may have a space formed therein, and a portion thereof may be formed to have an opening such that a substrate 100 may be withdrawn from or accommodated into the opening. The shield unit 320 including a gate value and the like may be arranged in the open portion of the chamber 310 and thus may be selectively opened or closed.

The deposition source 330 may receive a deposition material used to form an organic layer or the like on the substrate 100. At this time, the deposition source 330 may vaporize or sublime the deposition material by applying energy (for example, thermal energy, light energy, or vibration energy).

The deposition source 330 may be replaced. When the deposition source 330 runs out of the received deposition material, it may be replaced by a new deposition source 330.

The substrate support 340 may support the substrate 100. The substrate support 340 may support the substrate 100 by allowing the substrate 100 to be seated on the substrate support 340, or the substrate support 340 may support the substrate 100 by adsorbing or attaching one surface of the substrate 100 to the substrate support 340. For example, the substrate support 340 may include a frame, a bar, or the like that is fixed to the inside of the chamber 310. As another example, the substrate support 340 may include a clamp that holds the substrate 100. As another example, the substrate support 340 may include an adhesive chuck or an electrostatic chuck. In such a case, the substrate support 340 may be integrally formed with the magnetic force generator 360.

The mask support 350 may support the mask assembly 1000. The mask support 350 may be the same as or similar to the above-described substrate support 340, and thus a description thereof will be omitted for convenience of explanation. A case where the mask support 350 includes a frame fixed to the inside of the chamber 310 and the mask assembly 1000 is seated on the frame and supported thereby will now be focused on and described.

The magnetic force generator 360 may be arranged within the chamber 310 and may enable a mask frame 1100 to adhere to the substrate 100. The magnetic force generator 360 may include an electromagnet.

The pressure adjuster 370 may be connected to the chamber 310 and may adjust an internal pressure of the chamber 310. The pressure adjuster 370 may include a pipe connected to the chamber 310 and a pump located on the pipe.

The mask assembly 1000 may include the mask frame 1100 and a mask 1200.

Referring to FIGS. 2 and 3, the mask frame 1100 may include openings 1150 through which the deposition material may pass, and a plurality of frames that surround the openings 1150.

The mask frame 1100 may include a first frame 1110 and a second frame 1120 facing each other, and a third frame 1130 and a fourth frame 1140 facing each other. For example, the first frame 1110 may be spaced apart from the second frame 1120 in an x direction corresponding to a lengthwise direction of the mask 1200, and may extend in a y direction that intersects the lengthwise direction of the mask 1200. The third frame 1130 may extend in the x direction, and may be spaced apart from the fourth frame 1140 in the y direction. The first frame 1110 may be connected to the third frame 1130 and the fourth frame 1140, and the second frame 1120 may be connected to the third frame 1130 and the fourth frame 1140. Likewise the third frame 1130 may be connected to the first frame 1110 and the second frame 1120, and the fourth frame 1140 may be connected to the first frame 1110 and the second frame 1120. The mask frame 1100 may be manufactured of a rigid material that is not greatly deformed while the mask 1200 is being welded.

According to an embodiment, a support stick 1160 may be included in the mask frame 1100. The support stick 1160 may be overlapped by a non-opening region 1240 of the mask 1200, which will be described later. The support stick 1160 may extend in the y direction and may be connected to the third frame 1130 or the fourth frame 1140. The support stick 1160 may prevent deposition of the deposition material on a portion of the substrate 100 other than a predetermined portion thereof, so that the deposition material is deposited on only the predetermined portion. The support stick 1160 may prevent or reduce the mask frame 1100 from being bent due to the weight of the mask 1200, and may support the mask frame 1100.

The mask 1200 may be mounted on the mask frame 1100. The mask 1200 may be manufactured of stainless steel, invar, nickel (Ni), cobalt (Co), a Ni alloy, an Ni—Co alloy, or the like.

According to an embodiment, a width of the mask 1200 may be less than that of the openings 1150. For example, referring to FIG. 2, a width of the mask 1200 in the y direction may be less than a width of the openings 1150 in the y direction. Accordingly, a plurality of masks 1200 may be mounted on the mask frame 1100, in order to prevent or reduce the mask frame 1100 from sagging due to the weight of the mask 1200. According to another embodiment, a width of each mask 1200 may be greater than a width of each opening 1150. In this case, for example, the width of the mask 1200 in the y direction may be greater than that of the opening 1150 in the y direction. Accordingly, the plurality of masks 1200 may be integrally mounted on the mask frame 1100. For convenience of description, a case where the width of each mask 1200 is less than that of each opening 1150 will now be focused on and described in detail.

The masks 1200 may be consecutively arranged between the third frame 1130 and the fourth frame 1140. Both ends E1 and E2 of each mask 1200 may be welded and fixed to the first frame 1110 and the second frame 1120, respectively. The masks 1200 may cover the openings 1150.

Each mask 1200 may include welding regions 1210, deposition regions 1230, and a non-opening region 1240. The welding regions 1210 may be included in both ends E1 and E2 of the mask 1200, respectively. The welding regions 1210 may be connected to the mask frame 1100. For example, the welding regions 1210 may be welded and fixed and connected to the first frame 1110 or the second frame 1120.

The deposition regions 1230 may be regions corresponding to the openings 1150. Each of the deposition regions 1230 may include a plurality of deposition openings 1235, and the deposition material may pass through the mask 1200 via the plurality of deposition openings 1235. According to an embodiment, the deposition regions 1230 may be spaced apart from each other at certain intervals. For example, the deposition regions 1230 may be spaced apart from each other in the x direction. According to another embodiment, the deposition regions 1230 may be consecutively included to face the openings 1150. A case where the deposition regions 1230 are spaced apart from each other at certain intervals will now be focused on or described.

Figure 4:
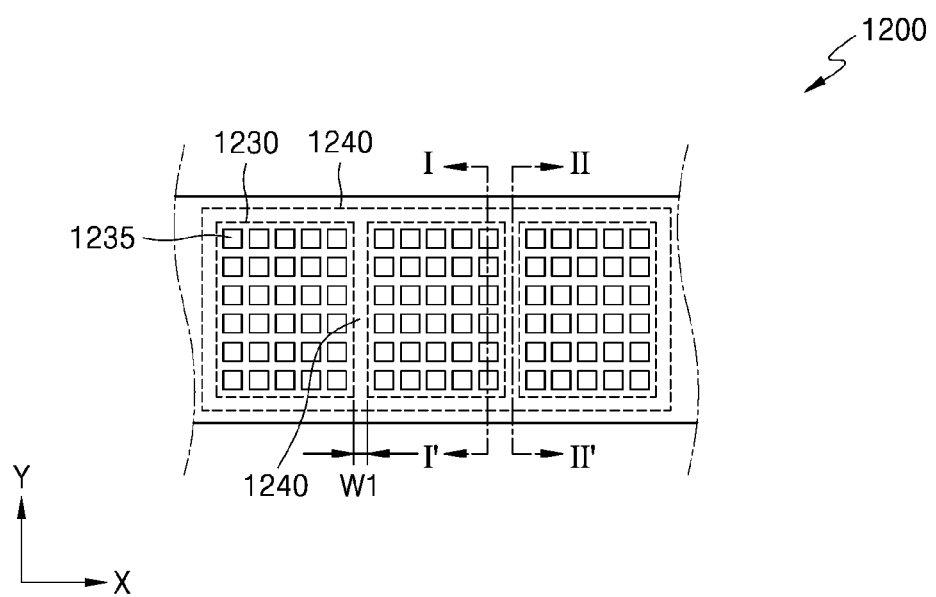
FIG. 4 is a schematic plan view illustrating a mask according to an exemplary embodiment of the invention.

FIG. 4 is a schematic plan view illustrating a mask 1200 according to an embodiment.

Referring to FIG. 4, the mask 1200 may include the deposition regions 1230 that face openings and through which the deposition material passes, and the non-opening region 1240 arranged around and between the deposition regions 1230.

Each deposition region 1230 may include deposition openings 1235. According to an embodiment, a plurality of deposition openings 1235 may be included and may be spaced apart from each other in the x direction or the y direction. Each of the deposition openings 1235 may have any of various shapes, such as a rectangle and a polygon.

The non-opening region 1240 may be arranged around and between the deposition regions 1230. The non-opening region 1240 may be arranged outside the deposition regions 1230. For example, the non-opening region 1240 may be arranged by surrounding at least respective portions of the deposition regions 1230. The non-opening region 1240 may be arranged by surrounding at least respective portions of the deposition regions 1230 in at least some of the lengthwise direction of the mask 1200 of the deposition region 1230 and a direction intersecting the lengthwise direction of the mask 1200. According to another embodiment, the non-opening region 1240 may be between adjacent deposition regions 1230. When a plurality of deposition regions 1230 and a plurality of non-opening regions 1240 are included and the deposition regions 1230 are spaced apart from each other, each of the plurality of non-opening regions 1240 may be between the plurality of deposition regions 1230. For example, the plurality of deposition regions 1230 may be arranged in the x direction, and a non-opening region 1240 may be arranged between the plurality of deposition regions 1230. For example, the deposition regions 1230 and the non-opening regions 1240 may alternate with each other.

A non-opening region 1240 between adjacent deposition regions 1230 may have a first width W1 in the x direction. The first width W1 of the non-opening region 1240 may be about 200 µm to about 700 µm, about 200 µm to about 600 µm, or about 300 µm to about 500 µm. In this way, the first width W1 of the non-opening region 1240 may vary.

As will be described later with reference to FIG. 9, laser welding may be performed on a non-opening region 1240, and thus a welding nugget may be formed. At this time, because the welding nugget formed by laser welding may have a size of about 200 µm to about 300 µm, when the width of the non-opening region 1240 is small, the welding nugget may be formed in a deposition region 1230. When the width of the non-opening region 1240 is large, a repulsive force may be generated for a reason such as a change in an end of the deposition region 1230 and the physical property of the non-opening region 1240, and thus the adhesion force of the mask 1200 may decrease. Accordingly, the first width W1 of the non-opening region 1240 between the adjacent deposition regions 1230 may be about 200 µm to about 500 µm.

Because no openings are defined in the non-opening region 1240, the non-opening region 1240 may not transmit the deposition material. As described above with reference to FIG. 2, the mask assembly 1000 may further include the support sticks 1160 extending in the y direction, and the support sticks 1160 included in the mask assembly 1000 may be overlapped by the non-opening region 1240 of the mask 1200.

Figure 5:
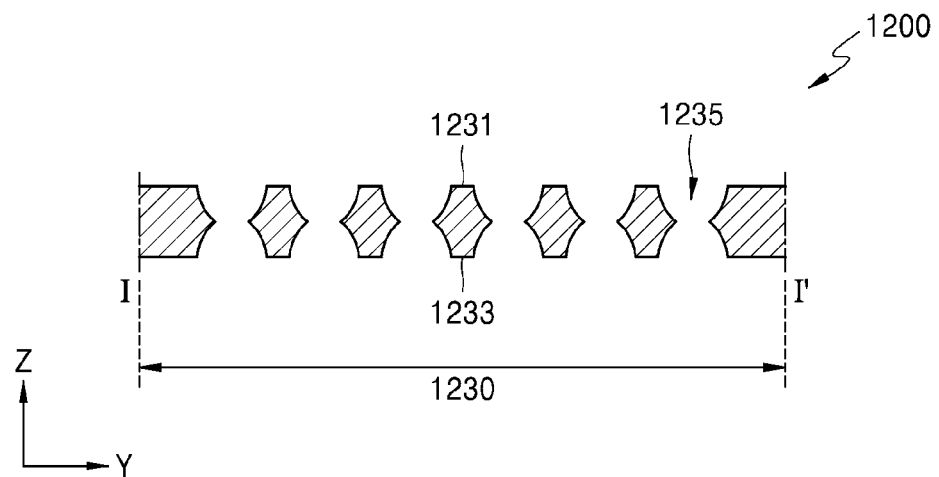
FIGS. 5 and 6 are schematic cross-sectional views illustrating a mask according to an exemplary embodiment of the invention.
Figure 6:
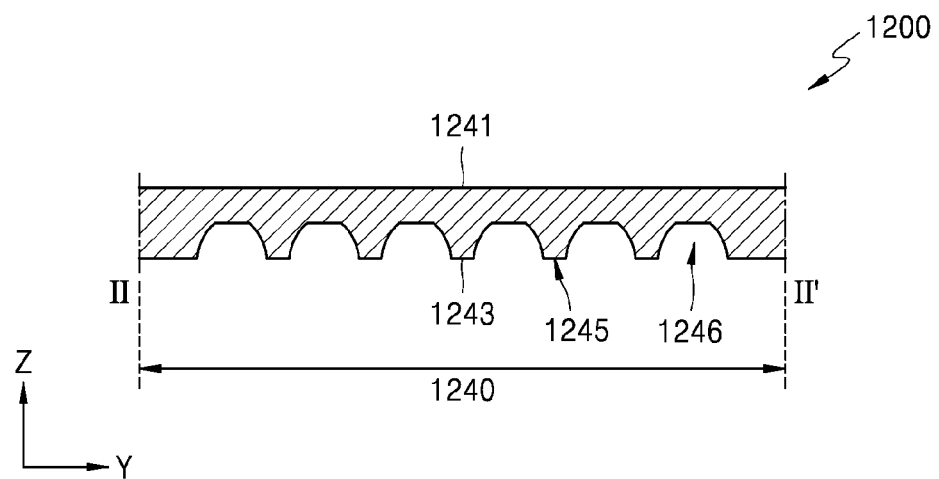

FIGS. 5 and 6 are schematic cross-sectional views illustrating the mask 1200 according to an embodiment. FIG. 5 is a cross-sectional view of the mask 1200 taken along line I-I' of FIG. 4 crossing two non-opening regions 1240 and a deposition region 1230, and FIG. 6 is a cross-sectional view of the mask 1200 taken along line II-II' of FIG. 4 crossing only non-opening regions 1240. Reference numerals in FIGS. 5 and 6 that are the same as the reference numerals in FIG. 4 denote the same elements, and thus repeated descriptions thereof are omitted.

Referring to FIG. 5, according to an embodiment, a deposition region 1230 of the mask 1200 may include a plurality of deposition openings 1235, and the plurality of deposition openings 1235 may be formed via chemical etching. For example, after one surface 1231 of the mask 1200 of the deposition region 1230 is etched a predetermined depth, another surface 1233 opposite to the one surface 1231 of the mask 1200 may be etched a predetermined depth to form the plurality of deposition openings 1235. According to another embodiment, the plurality of deposition openings 1235 may be formed by radiating laser to the deposition region 1230 of the mask 1200.

When the deposition openings 1235 are included in only the deposition region 1230, waves may be generated due to a difference between the volumes of the deposition region 1230 and the non-opening region 1240.

Referring to FIG. 6, according to an embodiment, the non-opening region 1240 of the mask 1200 may include a first portion 1245, and a second portion 1246 having a smaller thickness in the z direction than the first portion 1245. In more detail, the second portion 1246 may be formed by etching another surface 1243 opposite to one surface 1241 of the mask of the non-opening region 1240 by a predetermined depth. The second portion 1246 of the non-opening region 1240 may be a portion obtained by etching half of a thickness of the mask 1200. This process may refer to half-etching in a z direction a thickness direction of the mask 1200.

Because the another surface 1243 of the mask 1200 on the non-opening region 1240 is half etched and thus the non-opening region 1240 includes the first portion 1245 and the second portion 1246 having less of a thickness in the z direction than the first portion 1245, the non-opening region 1240 may have a similar volume to the deposition region 1230 including the deposition openings 1235. Due to the non-opening region 1240 having a similar volume to the deposition region 1230 including the deposition openings 1235, generation of waves due to a difference between the volumes of the deposition region 1230 and the non-opening region 1240 may be prevented.

Figure 7:
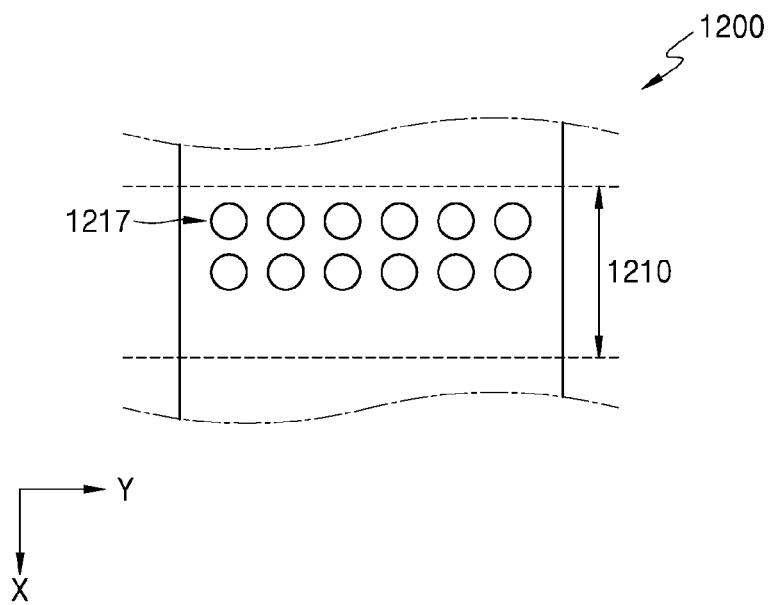
FIGS. 7, 8, and 9 are schematic plan views illustrating a mask according to an exemplary embodiment of the invention.
Figure 8:
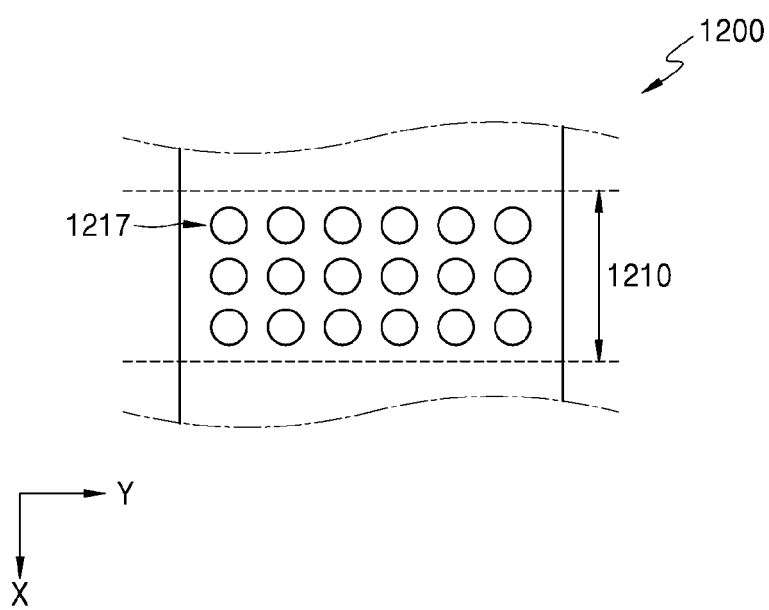
Figure 9:
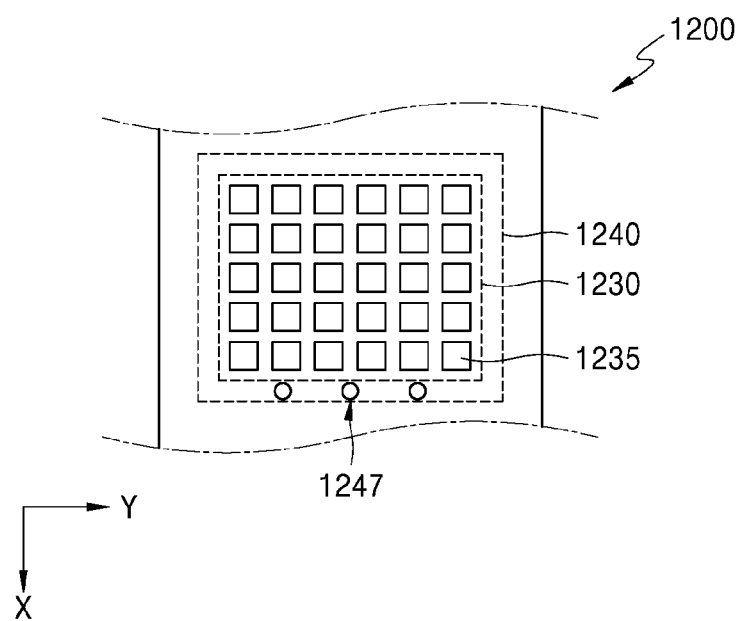

FIGS. 7, 8, and 9 are schematic plan views illustrating the mask 1200 according to embodiments of the inventive concepts. In more detail, FIGS. 7 and 8 are schematic plan views of a welding region 1210 of the mask 1200 according to an embodiment, and FIG. 9 is a schematic plan view of a non-opening region 1240 of the mask 1200 according to embodiments. Reference numerals in FIGS. 7 through 9 that are the same as the reference numerals in FIG. 4 denote the same elements, and thus repeated descriptions thereof are omitted.

Referring to FIG. 7, the mask 1200 may include the welding region 1210. The welding region 1210 may be a region of the mask 1200 that is connected to the mask frame 1100. In more detail, laser may be radiated to the welding region 1210, and thus the mask 1200 may be welded and fixed to the mask frame 1100. During laser welding, a plurality of first nuggets 1217 (for example, welding nuggets) may be formed in the welding region 1210 of the mask 1200. Each of the first nuggets 1217 formed via laser welding may have a size of about 200 µm to about 300 µm.

Referring to FIG. 8, pixel position accuracy (PPA) in the x direction may be arranged via additional welding on the welding region 1210 of the mask 1200. In more detail, when additional laser welding is applied to the welding region 1210 of the mask 1200, the deposition region 1230 of the mask 1200 adjacent to the welding region 1210 of the mask 1200 may extend in the X direction, and thus, PPA in the x direction may be corrected. Because PPA may be corrected through additional laser welding, this will now be referred to as welding correction.

However, because the welding region 1210 of the mask 1200 is included on either end of the mask 1200, respectively, an effect of welding correction due to additional welding may be applied to only a deposition region 1230 adjacent to the welding region 1210 of the mask 1200, and the effect of welding correction may not be applied to a deposition region 1230 far from the welding region 1210 of the mask 1200.

In more detail, the deposition openings 1235 of the deposition region 1230 adjacent to the welding region 1210 of the mask 1200 may be corrected in terms of PPA in the x direction, but the deposition openings 1235 of the deposition region 1230 far from the welding region 1210 of the mask 1200 may not be corrected in terms of PPA, and thus the PPA of the deposition region 1230 far from the welding region 1210 of the mask 1200 may decrease.

To address this problem, according to the disclosure, the non-opening region 1240 in which welding may be performed is arranged outside the deposition region 1230 of the mask 1200, and thus welding correction may be performed in the non-opening regions and thus even on the deposition region 1230 far from the welding region 1210 of the mask 1200. In particular, by arranging the non-opening region 1240 between adjacent deposition regions 1230, welding correction may be performed in the non-opening regions 1240 even on the deposition region 1230 far from the welding region 1210 of the mask 1200.

Referring to FIG. 9 and as discussed herein, the non-opening regions 1240 may be arranged outside the deposition regions 1230 of the mask 1200. A non-opening region 1240 may be arranged by surrounding at least a portion of the deposition region 1230. The non-opening region 1240 may be between adjacent deposition regions 1230. The non-opening region 1240 may be included such that welding correction may be performed even on the deposition region 1230 far from the welding region 1210 of the mask 1200. Laser may be radiated to the non-opening regions 1240, and thus PPA of the mask 1200 of the deposition region 1230 near the non-opening region 1240 may be corrected.

The non-opening region 1240 may include second nuggets 1247 (e.g., welding nuggets). In more detail, the non-opening regions 1240 may include second nuggets 1247 formed during welding correction via laser. Each of the second nuggets 1247 may have a size of 200 μm to 300 μm. Although three second nuggets 1247 (welding nuggets) are illustrated in FIG. 9, the number of second nuggets 1247 (welding nuggets) is not limited thereto. Three or less or more second nuggets 1247 (welding nuggets) may be included. In FIG. 9, the second nuggets 1247 (welding nuggets) are included in only a portion of the non-opening region 1240 arranged in relation to the deposition region 1230 in the x direction. However, second nuggets 1247 (welding nuggets) may be also included in a portion of the non-opening region 1240 arranged from the deposition region 1230 in the y direction and the opposing x direction.

Laser may be radiated to the non-opening region 1240, and thus welding correction may be performed. For example, when laser is radiated to a portion of the non-opening region 1240 between adjacent deposition regions 1230 in the x direction and thus welding correction is performed, the adjacent deposition regions 1230 may expand in the x direction without a change in the y direction, and, when laser is radiated to a portion of the non-opening region 1240 arranged from the deposition region 1230 in the y direction and thus welding correction is performed, deposition regions 1230 adjacent to the portion of the non-opening region 1240 in the y direction may shrink in the y direction without a change in the x direction.

Because the non-opening region 1240 is arranged outside the deposition region 1230, laser is radiated to the non-opening region 1240 and welding correction is performed, PPA correction may be performed even on the deposition region 1230 far from the welding region 1210 of the mask 1200, leading to an improvement in deposition accuracy and an increase in the yield.

Figure 10:
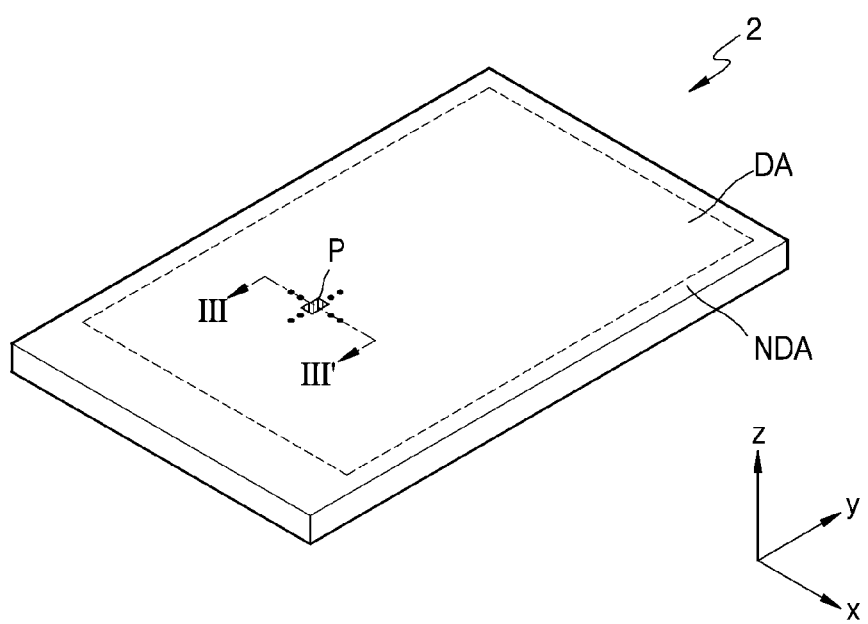
FIG. 10 is a schematic perspective view illustrating a display apparatus manufactured by an apparatus for manufacturing a display apparatus, according to an exemplary embodiment of the invention.
Figure 11:
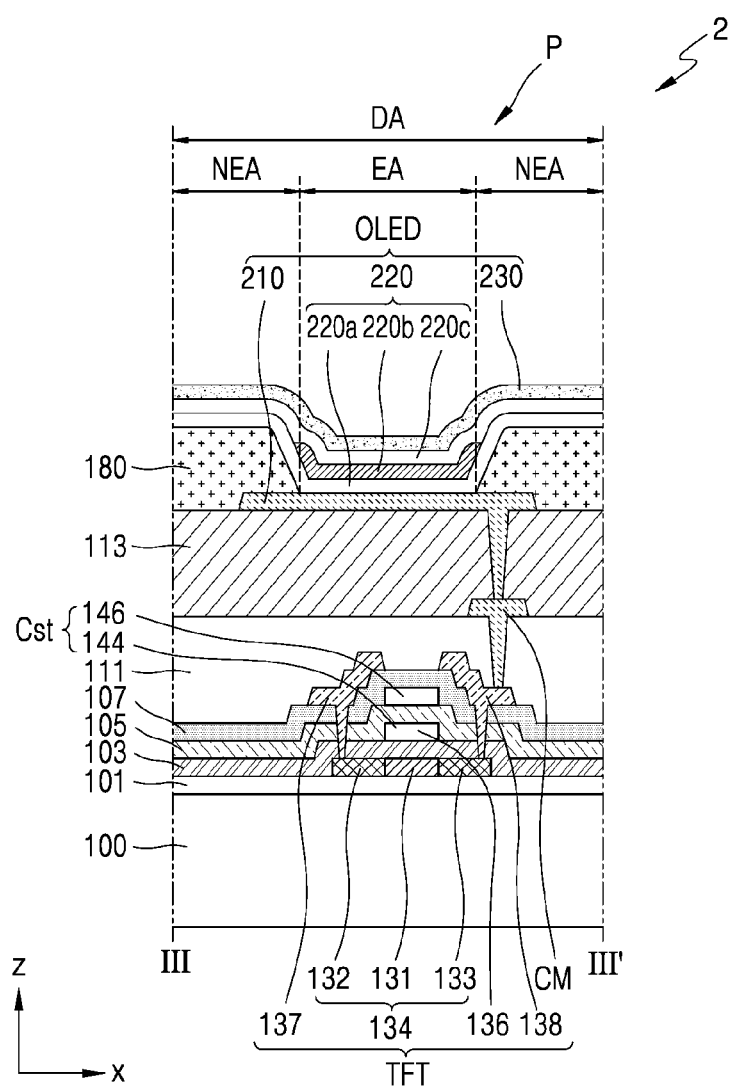
FIG. 11 is a schematic cross-sectional view illustrating a display apparatus manufactured by an apparatus for manufacturing a display apparatus, according to an exemplary embodiment of the invention.

FIG. 10 is a schematic perspective view illustrating a display apparatus 2 manufactured by an apparatus configured to manufacture a display apparatus according to an embodiment, and FIG. 11 is a schematic cross-sectional view of the display apparatus 2. FIG. 11 is a cross-sectional view of the display apparatus 2 taken along line III-III' of FIG. 10.

Referring to FIG. 10, the display apparatus 2 may include a display area DA and a non-display area NDA around the display area DA. The non-display area NDA may surround the display area DA. The display apparatus 2 may provide an image by using light emitted by a plurality of pixels P arranged in the display area DA. In the non-display area NDA, no images may be displayed.

Although an organic light-emitting display will now be illustrated and described as the display apparatus 2, the display apparatus 2 is not limited thereto. According to an embodiment, the display apparatus 2 may be an inorganic light-emitting display, a quantum dot light-emitting display, or the like. For example, an emission layer of a display element included in the display apparatus 2 may include an organic material, include an inorganic material, include quantum dots, include an organic material and quantum dots, or include an inorganic material and quantum dots.

Although FIG. 10 illustrates the display apparatus 2 including a flat display surface, embodiments of the disclosure are not limited thereto. According to an embodiment, the display apparatus 2 may include a three-dimensional display surface or a curved display surface.

When the display apparatus 2 includes a three-dimensional display surface, the display apparatus 2 may include a plurality of display areas pointing different directions, and, for example, may include a display surface in the form of a polyprism. According to another embodiment, when the display apparatus 2 includes a curved display surface, the display apparatus 2 may be implemented in various shapes including flexible, foldable, and rollable display apparatuses.

FIG. 10 illustrates the display apparatus 2 that may be applied to mobile phones. Although now illustrated, electronic modules, a camera module, a power supply module, and the like mounted on a main board may be arranged in a bracket/case or the like together with the display apparatus 2, thereby constituting a mobile phone. In particular, the display apparatus 2 is applicable to not only large-sized electronic apparatuses, such as televisions and monitors, but also small- and medium-sized electronic apparatuses, such as tablets, automobile navigation devices, game players, smart watches, etc.

In FIG. 10, the display area DA of the display apparatus 2 is rectangular.

However, the shape of the display area DA may be a circle, an oval, or a polygon such as a triangle or a pentagon.

The display apparatus 2 includes a plurality of pixels P arranged in the display area DA. Each of the plurality of pixels P may include an organic light-emitting diode OLED. Each of the plurality of pixels P may emit, for example, red light, green light, blue light, or white light, via the organic light-emitting diode OLED. The pixel P used herein may be understood as a pixel that emits one of red light, green light, blue light, and white light as described above.

Referring to FIG. 11, a display element may be arranged on the substrate 100. The display element may include a thin-film transistor TFT and the organic light-emitting diode OLED.

The substrate 100 may include glass or polymer resin. Examples of the polymer resin may include polyethersulphone, polyacrylate, polyetherimide, polyethylene naphthalate, polyethylene terephthalate, polyphenylene sulfide, polyarylate, polyimide, polycarbonate, and cellulose acetate propionate. The substrate 100 including polymer resin may have flexible, rollable, or bendable characteristics. The substrate 100 may have a multi-layered structure including a layer including the aforementioned polymer resin and an inorganic layer (not illustrated).

A buffer layer 101 may be arranged on the substrate 100. The buffer layer 101 may be positioned on the substrate 100 and may reduce or prevent infiltration of a foreign material, moisture, or ambient air from below the substrate 100 and may provide a flat surface on the substrate 100. The buffer layer 101 may include an inorganic material (such as oxide or nitride), an organic material, or an organic and inorganic compound, and may be a single layer or multiple layers of an inorganic material and an organic material.

The thin-film transistor TFT may be arranged on the buffer layer 101. The thin-film transistor TFT may include a semiconductor layer 134, a gate electrode 136 overlapping the semiconductor layer 134, and a connection electrode electrically connected to the semiconductor layer 134. The thin-film transistor TFT may be connected to the organic light-emitting diode OLED and may drive the organic light-emitting diode OLED.

The semiconductor layer 134 may be arranged on the buffer layer 101, and may include a channel region 131 that is overlapped by the gate electrode 136, and a source region 132 and a drain region 133 disposed on both sides of the channel region 131, respectively, and including a higher concentration of impurities than the channel region 131. The impurities may include N-type impurities or P-type impurities. The source region 132 and the drain region 133 may be electrically connected to the connection electrode.

The semiconductor layer 134 may include an oxide semiconductor and/or a silicon semiconductor. The semiconductor layer 134 may include oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the semiconductor layer 134 may be InSnZnO (ITZO), InGaZnO (IGZO), or the like. When the semiconductor layer 134 is formed of a silicon semiconductor, the semiconductor layer 134 may include, for example, amorphous silicon (a-Si) or low temperature poly-silicon (LTPS) obtained by crystallizing amorphous silicon (a-Si).

A first insulating layer 103 may be on the semiconductor layer 134. The first insulating layer 103 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first insulating layer 103 may be a single layer or multi-layer including the aforementioned inorganic insulating material.

The gate electrode 136 may be on the first insulating layer 103. The gate electrode 136 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) and may have a single-layered or multi-layered structure. The gate electrode 136 may be connected a gate line that applies an electrical signal to the gate electrode 136.

A second insulating layer 105 may be on the gate electrode 136. The second insulating layer 105 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second insulating layer 105 may be a single layer or multi-layer including the aforementioned inorganic insulating material.

A storage capacitor Cst may be on the first insulating layer 103. The storage capacitor Cst may include a lower electrode 144, and an upper electrode 146 overlapping the lower electrode 144. The lower electrode 144 and the upper electrode 146 of the storage capacitor Cst may overlap each other with the second insulating layer 105 therebetween.

The lower electrode 144 of the storage capacitor Cst may overlap the gate electrode 136 of the thin-film transistor TFT, and may be integrally arranged with the gate electrode 136 of the thin-film transistor TFT. According to an embodiment, the storage capacitor Cst may not overlap the thin-film transistor TFT, and the lower electrode 144 of the storage capacitor Cst may be a component independent from the gate electrode 136 of the thin-film transistor TFT.

The upper electrodes 146 of the storage capacitor Cst may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and and/or copper (Cu), and may each be a single layer or multi-layer including the aforementioned materials.

A third insulating layer 107 may be on the upper electrode 146 of the storage capacitor Cst. The third insulating layer 107 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The third insulating layer 107 may be a single layer or multi-layer including the aforementioned inorganic insulating material.

A source electrode 137 and a drain electrode 138 corresponding to the connecting electrode may be on the third insulating layer 107. Each of the source electrode 137 and the drain electrode 138 may include a conductive material including molybdenum (Mo), aluminum (Al), copper (Cu), and titanium (Ti), and may be a multi-layer or single layer including the aforementioned materials. Each of the source electrode 137 and the drain electrode 138 may have a multi-layer structure of Ti/Al/Ti.

A first planarization layer 111 may be on the source electrode 137 and the drain electrode 138. The first planarization layer 111 may be a single layer including an organic or inorganic material or a multi-layer formed by stacking single layers including an organic or inorganic material. According to an embodiment, the first planarization layer 111 may include a commercial polymer such as benzocyclobutene (BCB), polyimide (PI), hexamethyldisiloxane (HMDSO), polymethyl methacrylate (PMMA), or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The first planarization layer 111 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. After the first planarization layer 111 is formed, chemical and mechanical polishing may be performed to provide a flat upper surface.

A contact metal layer CM may be on the first planarization layer 111. The contact metal layer CM may include aluminum (Al), copper (Cu), or titanium (Ti), and may be formed as a single layer or as a multi-layer. The contact metal layer CM may be a multi-layer of Ti/Al/Ti.

A second planarization layer 113 may be on the contact metal layer CM. The second planarization layer 113 may be a single layer including an organic or inorganic material or a multi-layer formed by stacking single layers including an organic or inorganic material. The second planarization layer 113 may include a commercial polymer such as benzocyclobutene (BCB), polyimide (PI), hexamethyldisiloxane (HMDSO), polymethyl methacrylate (PMMA), or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The second planarization layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. After the second planarization layer 113 is formed, chemical and mechanical polishing may be performed to provide a flat upper surface. According to an embodiment, the second planarization layer 113 may be omitted.

The organic light-emitting diode OLED includes a pixel electrode 210, an intermediate layer 220, and an opposite electrode 230 and may be on the second planarization layer 113. The pixel electrode 210 may be electrically connected to the contact metal layer CM through a contact hole that penetrates through the second planarization layer 113, and the contact metal layer CM may be electrically connected to the source electrode 137 and the drain electrode 138 corresponding to the connecting electrode of the thin-film transistor TFT through a contact hole that penetrates through the first planarization layer 111, so that the organic light-emitting diode OLED may be electrically connected to the thin-film transistor TFT.

The pixel electrode 210 may be on the second planarization layer 113, and may be a (semi) light-transmissive electrode or a reflective electrode. The pixel electrode 210 may include a reflection layer including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or a compound thereof, and a transparent or semi-transparent electrode layer on the reflection layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The pixel electrode 210 may have a stack structure of ITO/Ag/ITO.

A pixel defining layer 180 may be on the second planarization layer 113. The pixel defining layer 180 may include an opening exposing at least a portion of the pixel electrode 210. An area exposed by the opening of the pixel defining layer 180 may be defined as a light-emission area EA. The vicinity of light-emission areas EA is a non-light-emission area NEA, and the non-light-emission area NEA may surround the light-emission areas EA. In other words, the display area DA may include a plurality of light-emission areas EA and a non-light-emission area NEA that surround the plurality of light-emission areas EA. The pixel defining layer 180 may prevent an arc from occurring on the edge of the pixel electrode 210 by increasing a distance between the pixel electrode 210 and the opposite electrode 230 over the pixel electrode 210. The pixel defining layer 180 may be formed of an organic insulating material, such as polyimide, polyamide, acryl resin, benzocyclobutene, hexamethyldisiloxane (HMDSO), or phenol resin, via spin coating or the like.

The intermediate layer 220 may be on the pixel electrode 210 of which at least a portion is exposed by the pixel defining layer 180. The intermediate layer 220 may include an emission layer 220b, and a first functional layer 220a and a second functional layer 220c may be selectively arranged below and above the emission layer 220b.

According to an embodiment, the intermediate layer 220 may be formed on the pixel electrode 210 of which at least a portion is exposed by the pixel defining layer 180, by using the above-described apparatus 1 of FIG. 1 to manufacture a display apparatus. In more detail, the emission layer 220b of the intermediate layer 220 may be formed on the pixel electrode 210 of which at least a portion is exposed by the pixel defining layer 180, by using the above-described apparatus 1 of FIG. 1 configured to manufacture a display apparatus.

The first functional layer 220a may include a hole injection layer (HIL) and/or a hole transport layer (HTL), and the second functional layer 220c may include an electron transport layer (ETL) and/or an electron injection layer (EIL).

The emission layer 220b may include an organic material including a fluorescent or phosphorescent material that emits red, green, blue, or white light. The emission layer 220b may include a low-molecular weight organic material or a high-molecular weight organic material.

When the emission layer 220b includes a low molecular weight material, the intermediate layer 220 may be a stack of an HIL, an HTL, an emission layer, an ETL, and an EIL in a single structure or a composite structure, and may include, as the low molecular weight material, any of various materials including copper phthalocyanine (CuPc), N,N'-Di(naphthalene-1-yl)-N,N'-diphenyl-benzidine (NPB), or tris-8-hydroxyquinoline aluminum ($Alq_3$). These layers may be formed via vacuum deposition.

When the emission layer includes a high-molecular weight material, the intermediate layer 220 may generally have a structure including an HTL and the emission layer. In this case, the HTL may include poly(ethylenedioxythiophene) (PEDOT), and the emission layer 220b may include a high-molecular weight material such as a polyphenylene vinylene (PPV)-based material or a polyfluorene-based material. The emission layer may be formed via screen printing, inkjet printing, laser induced thermal imaging (LITI), or the like.

The opposite electrode 230 may be on the intermediate layer 220. The opposite electrode 230 may be on the intermediate layer 220 to cover the entire intermediate layer 220. The opposite electrode 230 may be over the display area DA to cover the entire display area DA. In other words, the opposite electrode 230 may be integrally formed over the entire display panel to cover the plurality of pixels P arranged in the display area DA by using an open mask.

The opposite electrode 230 may include a conductive material having a low work function. For example, the opposite electrode 230 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials. Alternatively, the opposite electrode 230 may further include a layer, such as ITO, IZO, ZnO, or $In_2O_3$, on the (semi)transparent layer including any of the above-described materials.

When adjacent deposition regions of a mask are spaced apart from each other by a large distance, a repulsive force is generated due to a difference between the physical properties of an end of each deposition region and an area between the deposition regions, and thus the mask has a reduced adhesion force. In addition, when a deposition region includes deposition openings, waves are generated due to a difference between the volumes of the deposition region and a non-opening region. Moreover, welding correction may be performed via additional welding on the welding regions included on both ends of the mask, but an effect of the welding correction is applied to only deposition regions that are adjacent to the welding regions.

To address these problems, according to an embodiment of the disclosure, there are provided a mask assembly in which a non-opening region having a width of about 200 μm to about 500 μm is arranged between adjacent deposition regions to prevent a repulsive force from being generated due to the physical property difference, a first portion and a second portion having a less thickness than the first portion are arranged on one surface of the non-opening region via half etching to prevent waves from being generated due to the difference between the volumes of the deposition region and the non-opening region, and laser welding is performed on the non-opening region so that welding correction may also be applied to deposition regions far from the welding regions of the mask, and an apparatus configured to manufacture a display apparatus.

According to an embodiment of the disclosure as described above, provided are a mask assembly having improved PPA due to arrangement of a non-opening region between deposition regions of a mask, an apparatus configured to manufacture a display apparatus, and a method of manufacturing a display apparatus. Of course, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A mask assembly comprising:
   a mask frame including a plurality of openings; and
   a mask arranged on the mask frame and including a plurality of deposition regions and a non-opening region surrounding the plurality of deposition regions, the plurality of deposition regions facing the plurality of openings to receive a deposition material,
   wherein a portion of the non-opening region disposed between each of the plurality of deposition regions has a width of about 200 μm to about 500 μm in a lengthwise direction of the mask.

2. The mask assembly of claim 1, wherein the non-opening region of the mask includes a first portion and a second portion having a thickness less than that of the first portion.

3. The mask assembly of claim 2, wherein the second portion is obtained via half etching in a thickness direction of the mask.

4. The mask assembly of claim 1, wherein the mask frame further comprises a support stick extending in a direction that intersects the lengthwise direction of the mask.

5. The mask assembly of claim 4, wherein the non-opening region of the mask overlaps the support stick.

6. The mask assembly of claim 1, wherein the mask further comprises a welding region welded and fixed to the mask frame.

7. The mask assembly of claim 6, wherein the welding region is provided on both ends of the mask in the lengthwise direction of the mask.

8. The mask assembly of claim 6, wherein the welding region comprises a first nugget.

9. The mask assembly of claim 1, wherein the non-opening region of the mask comprises a second nugget.

10. The mask assembly of claim 1, wherein:
    the mask is provided in plurality and mounted on the mask frame; and
    a width of each of the masks is less than a width of each of the openings.

11. A method of manufacturing a display apparatus, the method comprising:
    forming a pixel electrode;
    forming an emission layer on the pixel electrode by arranging a substrate in a chamber, arranging a deposition source in the chamber configured to supply a deposition material into the chamber, arranging a mask assembly to face the deposition source and configured to receive the deposition material and deposit the deposition material on the substrate, the mask assembly having a mask frame including a plurality of openings, a mask arranged on the mask frame and including a plurality of deposition regions and a non-opening region arranged around the plurality of deposition regions, the plurality of deposition regions facing the plurality of openings and configured to receive the deposition material, wherein a portion of the non-opening region disposed between each of the plurality of deposition regions has a width of about 200 μm to about 500 μm in a lengthwise direction of the mask; and
    forming an opposite electrode on the emission layer.

* * * * *